(12) United States Patent
Pan et al.

(10) Patent No.: US 11,430,682 B2
(45) Date of Patent: Aug. 30, 2022

(54) RETICLE POD AND GRIPPING UNIT THEREOF

(71) Applicant: Gudeng Precision Industrial CO., LTD., New Taipei (TW)

(72) Inventors: Yung-Chin Pan, New Taipei (TW); Chih-Ming Lin, New Taipei (TW); Ming-Chien Chiu, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 676 days.

(21) Appl. No.: 16/451,004

(22) Filed: Jun. 24, 2019

(65) Prior Publication Data

US 2020/0335362 A1 Oct. 22, 2020

(30) Foreign Application Priority Data

Apr. 16, 2019 (TW) ................................ 108113284

(51) Int. Cl.
*G03F 1/66* (2012.01)
*H01L 21/677* (2006.01)
*H01L 21/673* (2006.01)

(52) U.S. Cl.
CPC ...... *H01L 21/677* (2013.01); *H01L 21/67359* (2013.01); *G03F 1/66* (2013.01)

(58) Field of Classification Search
CPC .. H01L 21/6773; H01L 21/67359; G03F 1/66
See application file for complete search history.

(56) References Cited

U.S. PATENT DOCUMENTS

| 2010/0117391 A1* | 5/2010 | Murata | H01L 21/67379 294/86.4 |
| 2019/0229003 A1* | 7/2019 | Kesil | H01L 21/67712 |

FOREIGN PATENT DOCUMENTS

| JP | WO 2013187104 | * 12/2013 | B65D 51/00 |
| JP | WO2013187104 | * 12/2013 | H01L 21/677 |

* cited by examiner

*Primary Examiner* — Ronald P Jarrett
(74) *Attorney, Agent, or Firm* — Cheng-Ju Chiang

(57) ABSTRACT

This invention discloses a reticle pod and gripping unit thereof. The aforementioned gripping unit comprises a gripping arm and at least two gripping modules. The gripping arm is hold and configured on the reticle pod, and each gripping module is deposed on the end of the gripping arm, passing through the reticle pod. A single gripping module comprises a case, a stopper and a spring unit. The case is configured on and in the reticle pod. The stopper is configured in the case and passes through the reticle pod. The spring unit is connected with the stopper.

10 Claims, 4 Drawing Sheets

RETICLE POD AND GRIPPING UNIT THEREOF

TECHNICAL FIELD

The present invention relates to a reticle pod and gripping unit thereof, particularly, to a reticle pod and gripping unit that clamps the reticle to avoid its displacement as the reticle pod is closed.

BACKGROUND OF RELATED ARTS

Masks play an indispensable role in the semiconductor industry, such as traditional photo lithography techniques, and even extreme ultraviolet (EUV) exposure techniques in recent years, masks still have a very important value.

Traditionally, the transfer or storage of a mask (also called reticle) has mostly been performed through a reticle pod. The reticle pod is divided into two categories: reticle transfer box and reticle storage box according to different requirements of transfer or storage. Even with the ever-changing technology, extreme ultraviolet (EUV) reticle has its own reticle transfer box and reticle storage box.

In the existing reticle pod, the preservation and placement of the reticle is often considered to meet the requirements of its bearing stability. For extremely precise reticle, when stored in a reticle pod, the most important thing is to keep the reticle clean and to avoid damage to the reticle due to collision or shaking of the reticle pod.

The fixing manner of the reticle fixed to the reticle pod has mostly adopted a passive bearing method. The passive bearing method can only solve the problem of fixing the reticle for a short time; however, the continuous contact friction for a long time is actually easy to cause wear of the reticle or the reticle pod.

Therefore, how to solve the passive reticle contact bearing mode is one of the problems to be solved in the semiconductor industry.

SUMMARY

To resolve the drawbacks of the prior arts, the present invention discloses a reticle pod and gripping unit thereof. The gripping unit comprises a gripping arm and at least two gripping modules. The gripping arm is hold and configured on the reticle pod. Each of the at least two gripping modules is deposed on an end of the gripping arm for passing through the reticle pod. Each of the at least two gripping modules comprises a case extending inside to outside of the reticle pod, a stopper configured in the case and passing through the reticle pod and a spring unit connected with the stopper. The spring unit is used to restore a position of the stopper.

Further, gripping unit is applied to a reticle pod. The reticle pod comprises an upper cover, a lower cover and a gripping unit. The lower cover is covering with the upper cover. The gripping unit comprises a gripping arm and at least two gripping modules. The gripping arm is gripped on the reticle pod. Each of the at least two gripping modules is deposed on an end of said gripping arm and passing through the upper cover. Each of the at least two gripping modules comprises a case, a stopper and a spring unit. The case is extending inside to outside of the upper cover, and the stopper is configured in the case and passing through the upper cover. The spring unit is connected with the stopper. The spring unit is used to restore a position of the stopper.

Embodiments of the invention are illustrated by way of example, and not by way of limitation, in the figures of the accompanying drawings in which like reference numerals refer to similar elements.

DETAILED DESCRIPTION OF THE INVENTION

In order to understand the technical features and practical effects of the present invention and to implement it in accordance with the contents of the specification, a preferred embodiment as shown in the figure is further described in detail as follows.

Figure 1:
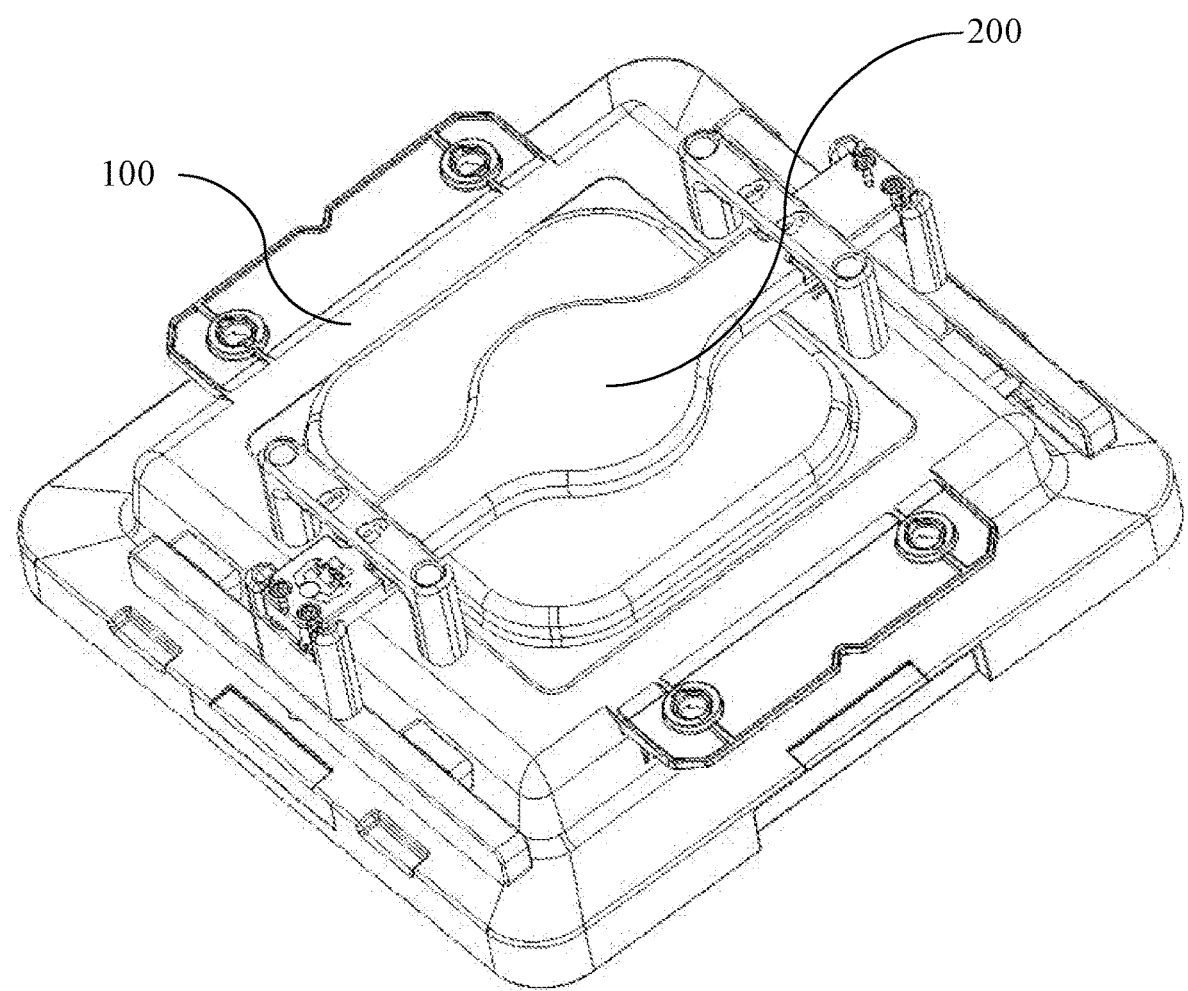
FIG. 1 is an external structure diagram of the reticle pod according to the embodiment of the present invention.

Firstly, referring to FIG. 1, it illustrates an external structure diagram of the reticle pod according to the embodiment of the present invention. As shown in FIG. 1, this embodiment of the present invention will be described in conjunction with the gripping unit (gripper) 200 and its applicable reticle pod 100. In this present embodiment, the gripping arm 201 in the gripping unit 200 is crossed over the reticle pod 100 by U-shaped bridging. The gripping unit 200 can be fixed on the reticle pod 100 by screws, etc.

In addition, the reticle pod 100 may be a reticle transfer pod, a reticle storage pod or an extreme ultraviolet reticle pod. The reticle pod 100 of this embodiment is implemented by using the reticle transfer pod that meets the standard mechanical interface (SMIF), but the present invention does not restrict the types of the reticle pod 100.

Figure 2:
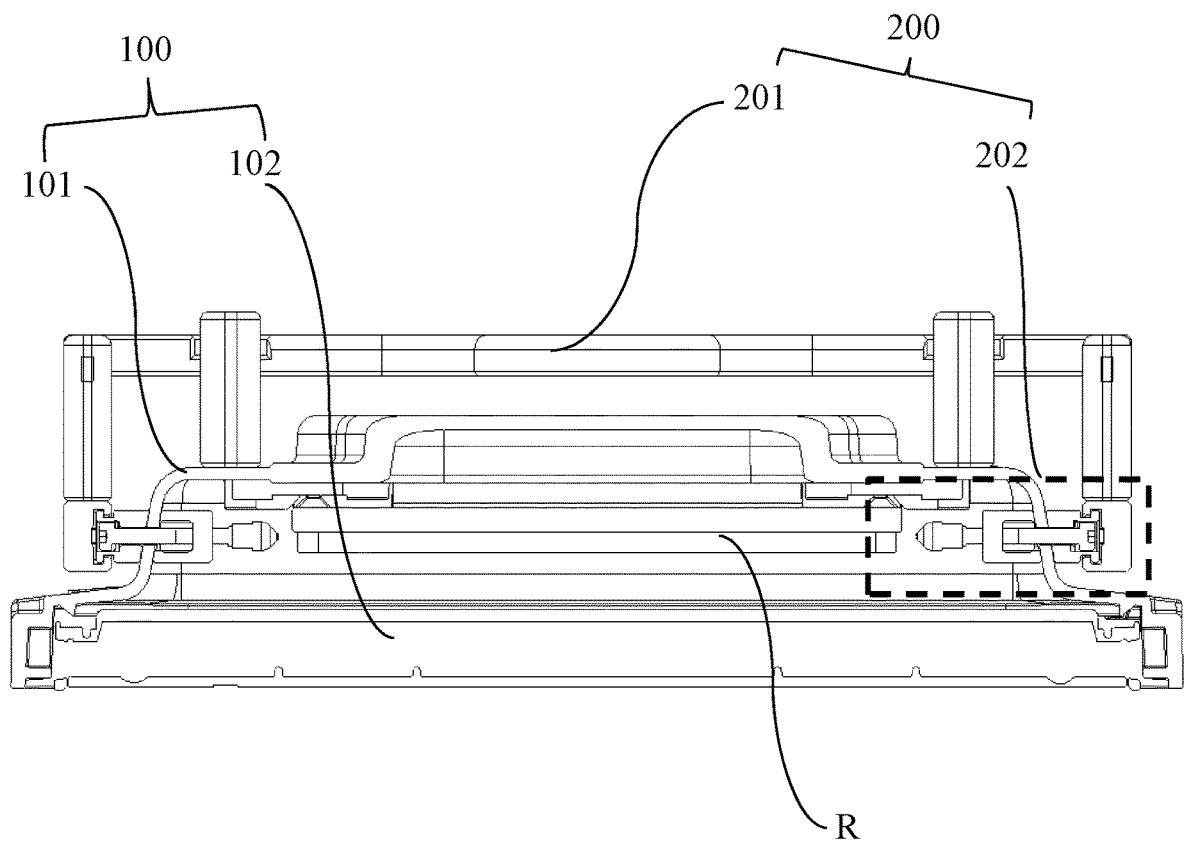
FIG. 2 illustrates a cross-sectional view of the ungripped state of the reticle in one embodiment of the present invention.
Figure 3:
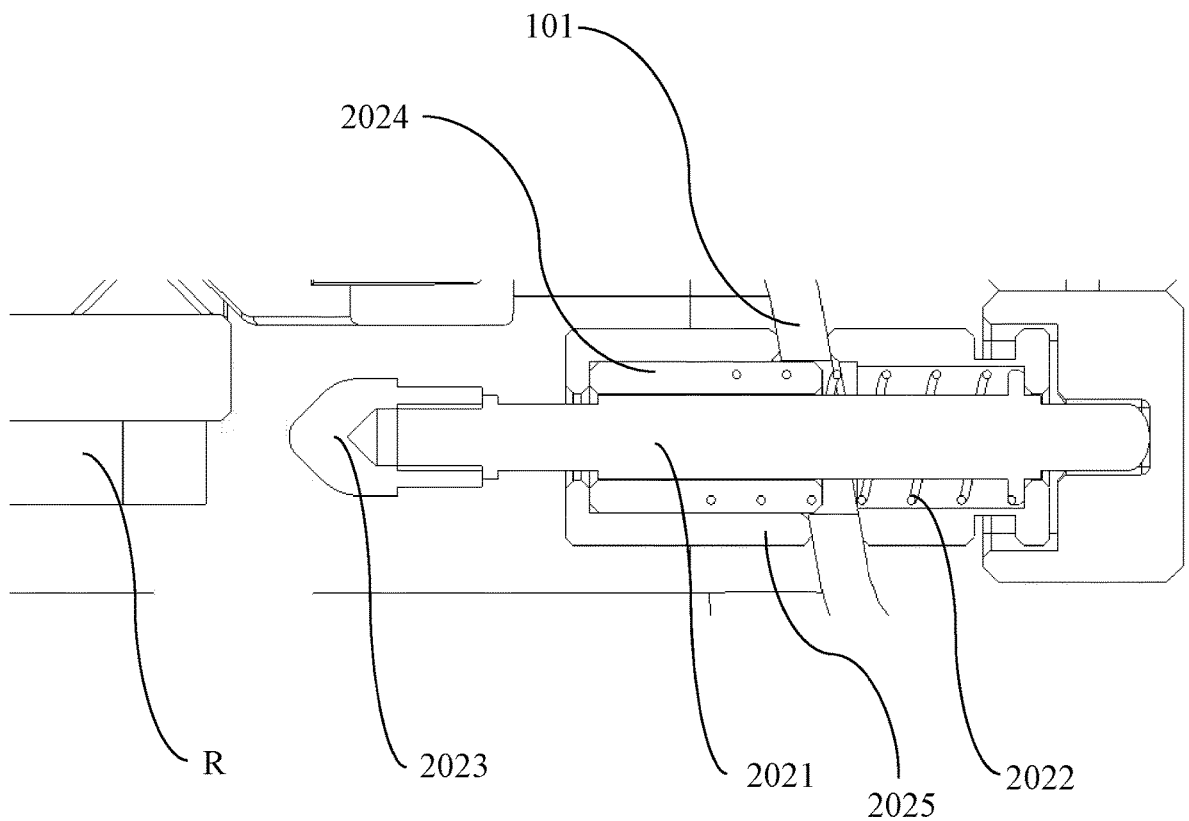
FIG. 3 illustrates a detailed cross-sectional view of the gripping unit in one embodiment of the present invention.
Figure 4:
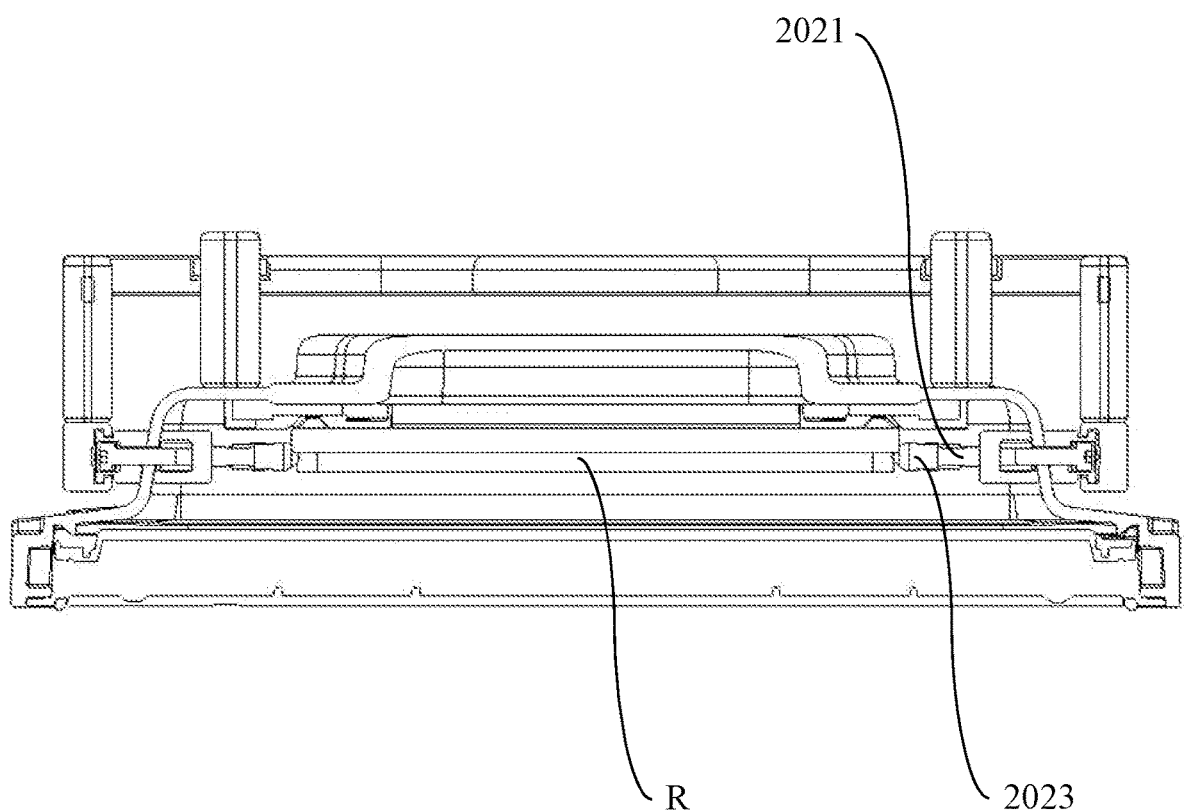
FIG. 4 illustrates a cross-sectional view of the gripped state of the reticle in one embodiment of the present invention.

Please refer to FIGS. 1-4. FIG. 2 illustrates a cross-sectional view of the ungripped state of the reticle in one embodiment of the present invention. FIG. 3 illustrates a detailed cross-sectional view of the gripping unit in one embodiment of the present invention. FIG. 4 illustrates a cross-sectional view of the gripped state of the reticle in one embodiment of the present invention. The dotted box in FIG. 2 indicates the gripping module 202 which enlarged view refers to FIG. 3. In other words, the assembly and combination of the reticle pod 100 and the gripping unit 202 of the present embodiment is presented in FIG. 1. The reticle pod 100 mainly comprises an upper cover 101, a lower cover 102 and the aforementioned gripping unit 200. The lower cover 102 can be covered (closed) with the upper cover 101, and the gripping unit 200 is composed of the gripping arm 201 and at least two gripping modules 202. Each gripping module 202 is arranged at the end of the gripping arm 201 and passes through the upper cover 101 to form the structure of the present embodiment.

As shown in FIGS. 2 and 3, the gripping unit 200 of the present embodiment mainly comprises a gripping arm 201 and at least two gripping modules 202. The gripping arm 201 is gripped on the reticle pod 100, and each gripping module 202 is located at the end of the gripping arm 201 and passes through the upper cover 101 of the reticle pod 100. In FIG. 2, it can be clearly seen that the reticle pod 100 is divided into two parts, including the upper cover 101 and the lower cover 102. The gripping unit 200 is mainly composed of the gripping arm 201 and the gripping module 202.

In this present embodiment, the gripping arm 201 is suspended above the upper cover 101 to form a U-shaped bridge. The gripping module 202 is arranged at the end of the U-shaped bridge structure of the gripping arm 201. In this embodiment, the gripping start condition of the gripping module 202 can be controlled by the user according to the requirement. The inward pressure exerted by the mechanical arm on the gripping arm 201 and the gripping module 202 can be used as the starting (actuating) condition. The manual switch can also be set on the outside of the gripping module 202 or a trigger can be actuated when the upper cover 101 is cover with the lower cover 102, so that the two gripping modules 202 can be activated automatically.

In fact, for the starting condition of the gripping module 202, a gripping action of the gripping module 202 can be triggered by crane lifting or snap-fit jointing for a specific mechanical structure when the reticle pod 100 is loaded or transferred. For example, when the U-shaped bridge-erection structure of the gripping arm 201 is lifted, an upward pulling force is generated, by which creates the force arms of both sides of the U-shaped bridge-erection structure to form an inverted trapezoid and squeeze inward, so that the gripping module 202 can start the mechanism of gripping the reticle. However, the present invention does not limit the conditions under which the gripping module 202 can be triggered.

In addition, each gripping module 202 in the present embodiment includes a case 2025, a stopper 2021 and a spring unit 2022. The case 2025 is configured inside and outside of the upper cover 101 of the reticle pod 100, and the stopper 2021 is located in the case 2025 and passes through the upper cover 101 of the reticle pod 100. The spring unit 2022 is connected to the stopper 2021. The spring unit 2022 is used to restore a position of the stopper 2021. Then, as shown in FIG. 3, in the present embodiment, the stopper 2021 is an arrow-shaped design, and the tip of the arrow (near the contact end of the reticle R) is equipped with a protective member 2023. The protective member 2023 of the present embodiment can be selected by any wear-resistant material with damping effect (such as silica gel, silicon resin coated or covered with Teflon material on its surface), which can effectively protect the reticle R and reduce the generation of micro-particles.

An air-tight part 2024 is arranged between the case (enclosure) 2025 and the stopper 2021, which can keep the air-tight state between the gripping module 202 and the upper cover of the reticle 100. The spring unit 2022 in this embodiment is arranged through the air-tight part 2024 in a spiral way and resists the bottom of the case 2025. When the stopper 2021 does not need to push forward to stop the reticle R, the spring unit 2022 can help the stopper 2021 return to its original position and achieve the effect of passive restoration.

Finally, referring to FIG. 4, when the gripping module 202 of one embodiment of the present invention is activated, the reticle R in the reticle pod 100 will be clamped by the left and right sides of the reticle. Through this activation mechanism, the reticle pod 100 of this embodiment of the present invention can have physical contact with the reticle R only when it is transported or under specific conditions, thus directly solving the problem that the traditional passive reticle pod will contact with the reticle for a long time and continuously.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. While the preferred embodiment of the invention has been illustrated and described, it will be appreciated that various changes can be made therein without departing from the spirit and scope of the invention.

What is claimed is:

1. A gripping unit, comprising:
   a gripping arm for gripping a reticle pod; and
   at least two gripping modules, each of said at least two gripping modules disposed on an end of said gripping arm for passing through said reticle pod; wherein each of said at least two gripping modules comprises a case extending inside to outside of said reticle pod,
   a stopper configured in said case and passing through said reticle pod and
   a spring unit connected with said stopper; wherein said spring unit is used to restore a position of said stopper.

2. The gripping unit of claim 1, wherein said stopper is equipped with a protective member.

3. The gripping unit of claim 1, further comprising an air-tight part arranged between said case and said stopper.

4. The gripping unit of claim 1, wherein stopper has an arrow-shape.

5. A reticle pod, comprising: an upper cover; a lower cover for covering said upper cover; and a gripping unit comprising: a gripping arm to grip said upper cover, and at least two gripping modules, each of said at least two gripping modules disposed on an end of said gripping arm and passing through said upper cover; wherein each of said at least two gripping modules comprises a case extending inside to outside of said upper cover, a stopper configured in said case and passing through said upper cover and a spring unit connected with said stopper; wherein said spring unit is used to restore a position of said stopper.

6. The reticle pod of claim 5, wherein said stopper is equipped with a protective member.

7. The reticle pod of claim 5, further comprising an air-tight part arranged between said case and said stopper.

8. The reticle pod of claim 5, wherein stopper has an arrow-shape.

9. The reticle pod of claim 5, wherein said at least two gripping modules are used to grip a reticle in said reticle pod.

10. The reticle pod of claim 5, wherein said reticle pod is a reticle transfer pod, a reticle storage pod or an extreme ultraviolet reticle pod.

* * * * *